United States Patent
van de Water et al.

(10) Patent No.: US 7,420,184 B2
(45) Date of Patent: Sep. 2, 2008

(54) PARTICLE-OPTICAL APPARATUS WITH TEMPERATURE SWITCH

(75) Inventors: Gerbert Jeroen van de Water, Eindhoven (NL); Petrus Martinus Hoeks, Eindhoven (NL)

(73) Assignee: Fei Company, Hillsboro, OR (US)

( * ) Notice: Subject to any disclaimer, the term of this patent is extended or adjusted under 35 U.S.C. 154(b) by 0 days.

(21) Appl. No.: 11/796,975

(22) Filed: Apr. 30, 2007

(65) Prior Publication Data
US 2007/0252090 A1 Nov. 1, 2007

(30) Foreign Application Priority Data
May 1, 2006  (EP) ................................. 0611333

(51) Int. Cl.
*H01J 37/20* (2006.01)
(52) U.S. Cl. .............. 250/442.11; 250/443.1; 250/311
(58) Field of Classification Search ........... 250/440.11, 250/443.11, 311, 442.11
See application file for complete search history.

(56) References Cited

U.S. PATENT DOCUMENTS 3,171,957 A 3/1965 Coleman et al.
5,986,270 A * 11/1999 Bormans et al. ....... 250/442.11
7,238,953 B2 * 7/2007 Zandbergen .......... 250/440.11

FOREIGN PATENT DOCUMENTS

| JP | 10 239224 | 9/1998 |
| JP | 10 275582 | 10/1998 |
| JP | 11 096953 | 4/1999 |
| JP | 2000 133189 | 5/2000 |

* cited by examiner

*Primary Examiner*—Nikita Wells
*Assistant Examiner*—Johnnie L Smith, II
(74) *Attorney, Agent, or Firm*—Scheinberg & Griner, LLP; Michael O Scheinberg

(57) ABSTRACT

The invention relates to a thermal switch for particle-optical apparatus. In, for example, a cryo-TEM (transmission electron microscope), a sample 34 that is placed at an extremity 20 of a sample holder 7 can be maintained at, for example, the temperature of liquid nitrogen. There is a need to be able to inspect a sample at, for example, room temperature in a simple manner, without heating the microscope as a whole from the cryogenic temperature to room temperature. By using the thermal switch 40, this becomes possible. To this end, the thermal switch changes the thermal path between a cold source 22 in the apparatus and the extremity 20 of the sample holder 7, whereby, in one position, position $46^a$, a connection is made from the extremity 20 to the cold source 22, and, in the other position, position $46^b$, a connection is made to a portion 44 of the apparatus that is maintained at room temperature.

25 Claims, 3 Drawing Sheets

PARTICLE-OPTICAL APPARATUS WITH TEMPERATURE SWITCH

The invention relates to a particle-optical apparatus equipped with a sample holder with an extremity, which extremity is embodied to have a sample attached thereto, cooling facilities for maintaining a cold source of the apparatus at a low temperature, and thermal connection means for cooling the extremity of the sample holder by thermally connecting the extremity of the sample holder to the cold source.

Such a particle-optical apparatus is known from U.S. Pat. No. 5,986,270.

Such particle-optical apparatus are used to study and/or modify samples in, for example, the pharmaceutical industry or in biological research laboratories. Such apparatus are known per se as, for example, TEM (Transmission Electron Microscope), STEM (Scanning Transmission Electron Microscope), SEM (Scanning Electron Microscope) and FIB (Focused Ion Beam apparatus).

As is known to the skilled artisan, such samples must often be studied and/or modified in a cooled state, so as to limit unwanted damage to the sample, for example. Cooling to cryogenic temperatures is hereby employed, whereby the temperature of, for example, liquid nitrogen or even of liquid helium is approached.

In the known apparatus, this occurs by cooling the cold source with the aid of boiling-down liquid nitrogen or liquid helium, and connecting the extremity of the sample holder to the cold source using a connection with good thermal conduction, such as with a braided copper wire.

Subsequently, the sample that has already been cooled can be attached to the sample holder with the aid of a manipulator. The sample holder will thus bring the sample to the desired temperature, and maintain that temperature, after which the sample can be studied. In general, the sample holder can also be controllably positioned so that, with the aid of the sample holder, one can determine which portion of the sample can be studied.

A disadvantage of the above-mentioned method is that it is also often desired to use the same apparatus to study and/or modify a sample at room temperature. Although this can be achieved by giving the cold source a temperature equal to room temperature, e.g. by removing the boiling-down liquid, one must realize that heating the cold source from, for example, the temperature of liquid helium to room temperature and vice versa is a time-consuming process. This is because the positional stability involved during the study of samples must be stable to a few nanometers or even less than 0.1 nm, so that even a slight temperature change or temperature drift of the sample holder during the study will lead to larger displacements.

There is therefore a need for particle-optical apparatus which are able to change and keep stable the temperature of the sample holder more rapidly than current particle-optical apparatus.

The invention aims to provide a solution to said problem.

To this end, the particle-optical apparatus according to the invention is characterized in that the thermal connection means comprise a thermal switch, which thermal switch has at least two different states that are distinguished by a different thermal conduction, as a result of which the thermal conduction from the extremity of the sample holder to the cold source is different for the different states, which, in operation, results in different temperatures of the sample holder for the different states of the thermal switch.

In an embodiment of the particle-optical apparatus according to the invention, said at least two states are also distinguished by a different thermal conduction from the extremity of the sample holder to a portion of the apparatus that, by approximation, is at room temperature.

Normally speaking, the extremity of the sample holder will be thermally well isolated with respect to portions of the apparatus that are at room temperature. This is because, in the case of poor isolation, the temperature of the extremity of the sample holder will be much higher that that of the cold source, and, in addition, more liquid nitrogen or helium, for example, will have to evaporate in order to maintain the temperature of the cold source. When, in that state whereby the extremity of the sample holder has to be maintained at room temperature, it is thermally well connected to a portion of the apparatus with a temperature that approximates to room temperature, the extremity of the sample holder will quickly reach a temperature that approximates to room temperature.

It should be noted that, in this context, the syntax "temperature that approximates to room temperature" should be interpreted as including the temperature occurring in parts of the apparatus as a result of water cooling. This type of apparatus is often equipped with water cooling, so as to carry off dissipation in certain elements in the apparatus, particularly coils that are used in particle-optical lenses. This cooling water is often well temperature-controlled, and has a temperature that does not deviate much from room temperature, so as to prevent condensation, for example.

In another embodiment of the particle-optical apparatus according to the invention, the cooling facilities are embodied to maintain the cold source at cryogenic temperatures. By connecting the cold source to external cooling at a cryogenic temperature, e.g. with the aid of a braided copper wire, the cold source can be maintained at a temperature that approximates to the temperature of the external cooling.

In a further embodiment of the particle-optical apparatus according to the invention, the cold source is kept at a cryogenic temperature by the cooling facilities by allowing boiling down of a liquid.

By allowing a liquid with a low boiling point to boil down, an external cooling with the temperature of the boiling-down liquid can be realized.

It should be noted that the boiling down can occur at atmospheric pressure, but also at a pressure that deviates significantly herefrom, such as a strongly reduced pressure.

In yet a further embodiment of the particle-optical apparatus according to the invention, the boiling-down liquid is liquid nitrogen or liquid helium.

By allowing liquid nitrogen, for example, to boil down in a thermos flask (dewar), a temperature of approx. 77 K is achieved, whereas, when using helium, a temperature of 4 K is achieved. It should be noted that, in this latter case, the helium is often located in a dewar, which dewar is placed in liquid nitrogen so as to impede overly rapid evaporation of the helium.

In another embodiment of the particle-optical apparatus according to the invention, the thermal switch comprises an element that can be mechanically displaced.

In yet another embodiment of the particle-optical apparatus according to the invention, the thermal switch exhibits more than two different states, which are distinguished in that the thermal conduction of the sample holder to different portions of the apparatus is different, which different portions of the apparatus are embodied to exhibit mutually different temperatures.

This embodiment has the advantage that the sample can be studied at different temperatures, such as a first temperature that approximates to that of liquid nitrogen, a second temperature that approximates to room temperature, and a third temperature of boiling water, for example.

In yet another embodiment of the particle-optical apparatus according to the invention, the sample holder comprises heating means.

This embodiment offers the possibility of studying samples at temperatures above room temperature by heating the sample holder. Such heating can, for example, occur by heating, for example, a resistance with an electric current.

In still another embodiment of the particle-optical apparatus according to the invention, the thermal switch can connect the extremity of the sample holder to a portion of the apparatus that is embodied to be kept at a temperature above room temperature with the aid of heating means.

Just as with the previous embodiment, this embodiment offers the possibility of studying samples at temperatures above room temperature, but now by thermally connecting the extremity of the sample holder to a portion of the apparatus that has a temperature above room temperature.

In another embodiment of the particle-optical apparatus according to the invention, the thermal switch can connect the extremity of the sample holder to a portion of the apparatus that is embodied to be kept at a temperature below room temperature with the aid of Peltier cooling.

In this embodiment, it is possible to study the sample at a temperature that is below room temperature and yet well above that of the cold source, which, for example, is kept at a temperature that approximates to that of liquid nitrogen.

In still another embodiment of the particle-optical apparatus according to the invention, the apparatus comprises a particle column from the group of transmission electron columns (TEM columns), scanning transmission electron columns (STEM columns), scanning electron columns (SEM columns) and focused ion beam columns (FIB columns).

The invention will now be described on the basis of Figures, in which like reference numerals indicate corresponding elements. To this end:

FIG. 1 renders a schematic depiction of a particle-optical appliance according to the invention in the form of a transmission electron microscope (TEM);

Figure 1:
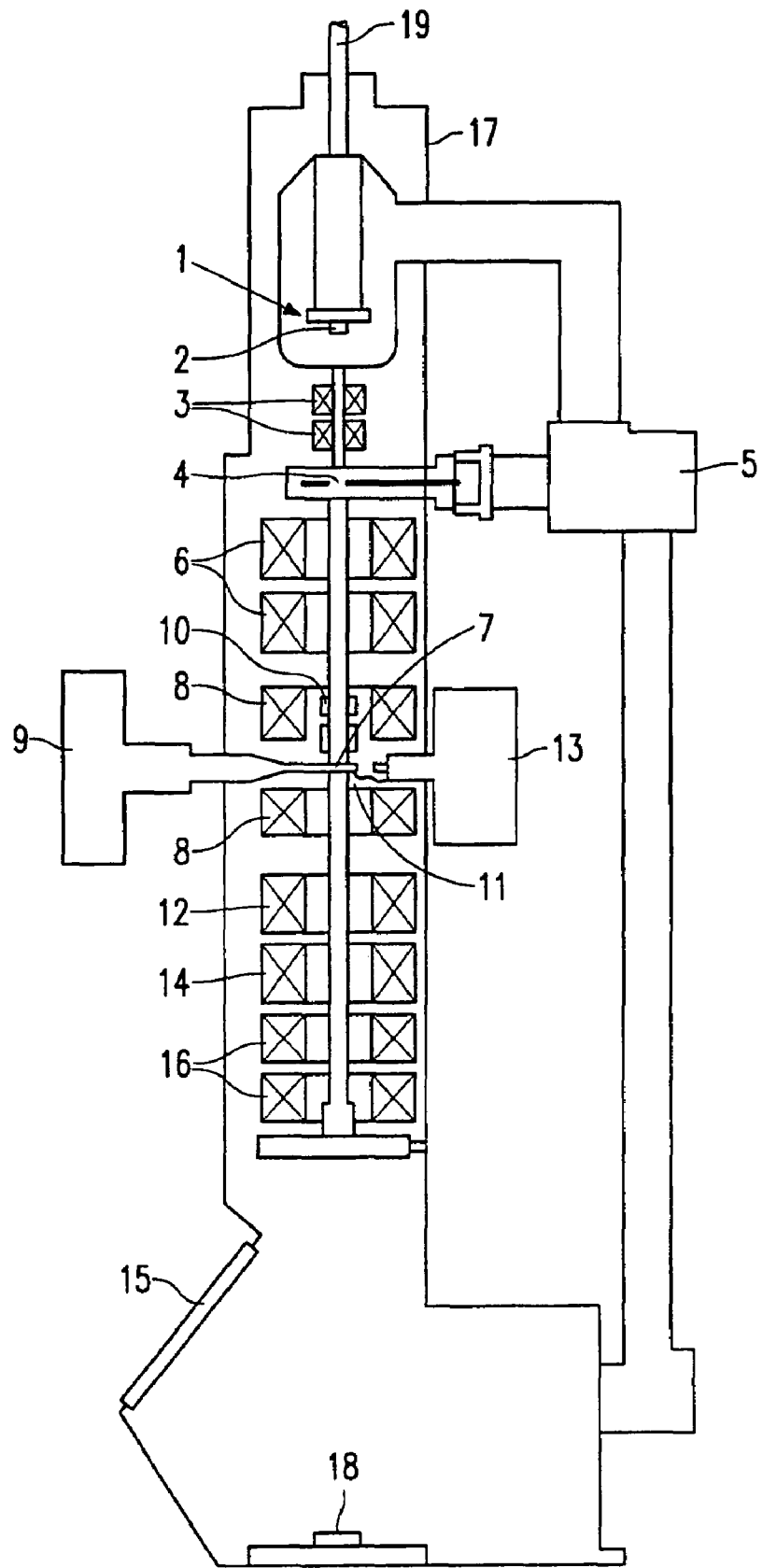

The electron microscope depicted in FIG. 1 comprises an electron source 1 with an electron emitting element 2, a beam alignment system 3, a beam diaphragm 4, condenser lenses 6, an objective lens 8, a beam probing system 10, an object space 11, a diffraction lens 12, an intermediate lens 14, a projection lens 16 and an electron detector 18. The objective lens 8, the intermediate lens 14 and the projection lens 16 together form an imaging lens system. These elements are fitted in a housing 17 with an electrical supply lead 19 for the electron source, a viewing window 15 and a vacuum pumping device 5. In the object space 11, a sample holder 7 is fitted, which is coupled to a control unit 9 for moving the sample holder 7. The sample holder is fitted through an opening in the housing 17 of the appliance. An input-and-output unit 13 is fitted through another opening in the housing of the appliance, located opposite the opening for the sample holder. Through yet another opening, which is not shown in this drawing but which is visible in FIG. 2, an operating element is fitted, for the purpose of operating the thermal switch. In addition, a cooling device is provided for the purpose of cooling the sample; this cooling device is not depicted in FIG. 1, but will be discussed on the basis of FIG. 2.

Figure 2:
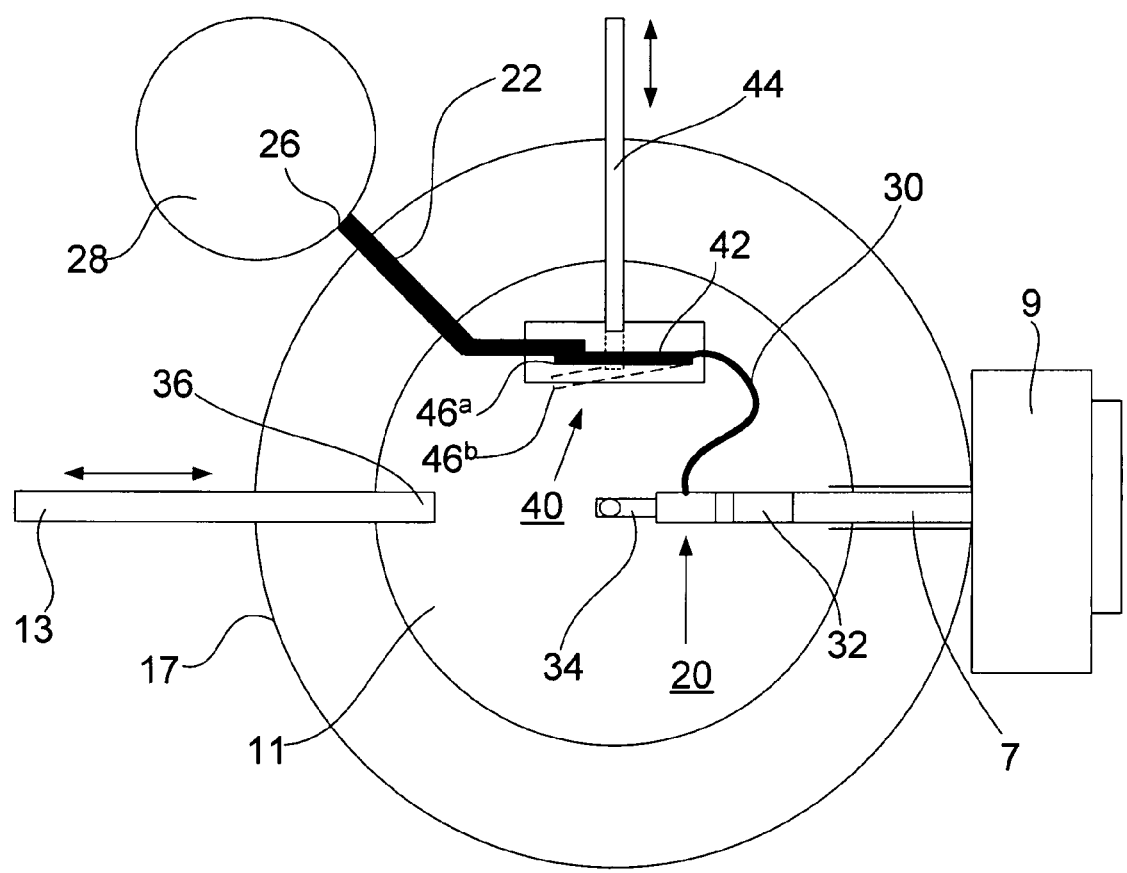
FIG. 2 shows, in schematic form, a horizontal cross-section of a column of an electron microscope such as depicted in FIG. 1 at the location of the sample holder, with a first embodiment of a cooled specimen carrier according to the invention.

FIG. 2 schematically depicts, in more detail, a horizontal cross-section of the column of the electron microscope according to FIG. 1, at the location of the sample holder 7. The housing 17 of the electron microscope comprises the object space 11 in which is located that extremity 20 of the sample holder 7 that is located in the appliance. Similarly, a portion of a transport unit 13 is located in the object space 11, which transport unit is only schematically depicted in FIG. 2. Also located in the object space 11 is an extremity of a cooling finger 22, which, via its other extremity 26, is in contact with the contents of a dewar vat 28, filled with liquid helium, for example. In the illustrated situation, the cooling finger 22 is connected to a heat conducting strip 42 of thermal switch 40, as a result of which extremity 20 of the sample holder 7 is cooled via the flexible cooling conductor 30 and the heat conducting strip. Also depicted is operating element 44 of the thermal switch. This operating element is thermally connected to a portion of the apparatus that is at room temperature, and is thereby also at room temperature itself. Between the extremity 20 and the rest of sample holder 7 a thermal isolator 32 is fitted, which impedes a flow of heat from outside the column through the sample holder to the sample 34. The extremity of the sample holder located outside the column is provided with a control unit 9 for the purpose of moving (translating and/or rotating) the sample holder 7.

In use, the cooled sample holder depicted in FIG. 2 is employed as follows. The sample holder 7 is brought into position and is held there during normal operation of the electron microscope. A flexible thermal conductor 30 is connected to the extremity 20 of the sample holder, which thermal conductor forms a good thermal contact between the extremity 20 and the heat conducting strip 42 of thermal switch 40. The heat conducting strip 42 is embodied to be resilient and can assume two extreme positions ($46^a$, $46^b$), corresponding to two states of the thermal switch 40. In one position, position $46^a$, this heat conducting strip is connected to the extremity of cooling finger 22. In this manner, the extremity 20 of cooling finger 22 is easily brought to the required low temperature. However, if operating element 44 is slid in the direction of the heat conducting strip 42, it will come into contact with this heat conducting strip. If the operating element 44 is further moved, the heat conducting strip will be forced into position $46^b$ and the connection of the heat conducting strip to the cooling finger will be terminated, whereas the contact between operating element 44 and the heat conducting strip 42 will cause a thermal connection of extremity 20 to a portion of the apparatus that is at room temperature. In this manner, the extremity 20 is brought to, and maintained at, room temperature.

A sample to be investigated is placed in transport unit 13 outside the column, after which the sample is introduced into the object space 11 using a method known per se (e.g. as is usual in the case of conventional sample holders), where it is located at an extremity 36 of an arm of the transport unit 13. The extremity 20 of the sample holder 7 is then brought into contact with the extremity 36 of the arm of the transport unit 13, so as to perform a take-over of the sample 34. It is therefore not necessary to move the sample holder 7 outside the column, so that the thermal equilibrium of this sample holder is not disturbed, or only disturbed to a small extent. Now, because cooling conductor 30 can be embodied to be flexible, and thereby forms a permanent connection, possible vibrations generated in or conducted through the dewar vat 28 are not transferred to the sample 34, whereas good cooling is nevertheless guaranteed.

It will be clear to the skilled artisan that the cooling finger can also be connected to (non-depicted) so-called cryo-shields, which surround the sample. By surrounding the sample by these cryo-shields, contamination of the sample will reduce, both when the sample is at cryogenic temperatures and when it is at room temperature.

Figure 3:
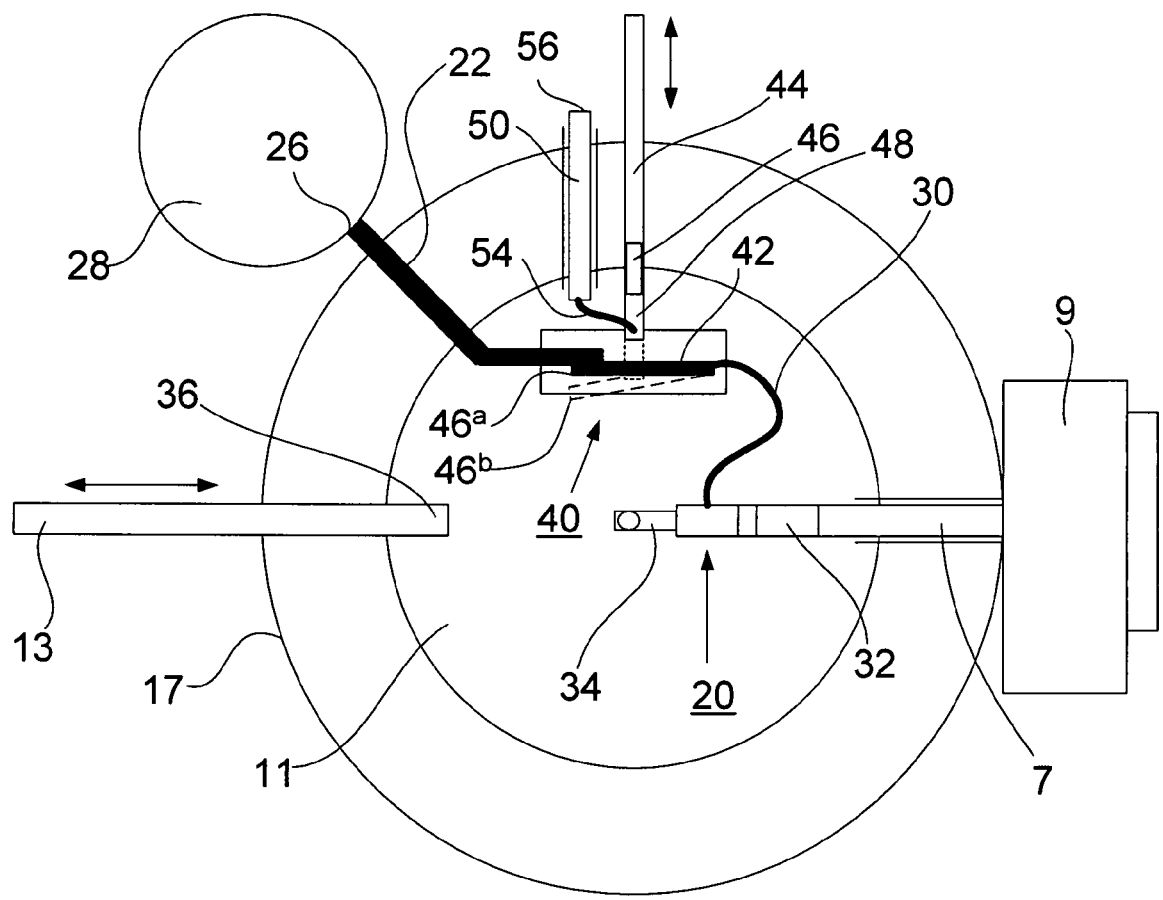
FIG. 3 shows, in schematic form, a horizontal cross-section of a column of an electron microscope such as depicted in FIG. 1 at the location of the sample holder, with a second embodiment of a cooled specimen carrier according to the invention.

FIG. 3 shows, in schematic form, a horizontal cross-section of a column of an electron microscope, such as depicted in FIG. 1, at the location of the sample holder, with a second embodiment of a cooled specimen carrier according to the invention. FIG. 3 can be regarded as having arisen out of FIG. 2. In this embodiment, the operating element 44 is embodied to have a thermal isolator 46, which makes it possible to have a temperature difference between the extremity of the operating element that protrudes outside the housing 17 of the apparatus and the other extremity 48 that can be brought into contact with the heat conducting strip 42. The extremity 48 of the operating element is thermally connected via a flexible connection 54 to a thermal feed-through 50. The extremity 56 of this feed-through 50 that is located outside housing 17 of the apparatus can be maintained at a temperature that is different to room temperature, e.g. by connecting this extremity to a Peltier cooler or a heating unit. In this manner, it is possible to bring the sample 34 to a temperature that is different from room temperature when switch 40 is in position $46^b$.

It will be clear to the skilled artisan that many variations can be conceived for the construction of the thermal switch. It will also be clear to the skilled artisan that this thermal switch can not only be applied in a TEM, but also in other particle-optical apparatus.

We claim as follows:

1. A particle-optical apparatus equipped with:
    A sample holder with an extremity, which extremity is embodied to have a sample attached thereto;
    Cooling facilities for maintaining a cold source of the apparatus at a low temperature, and;
    A thermal connection for cooling the extremity of the sample holder by thermally connecting the extremity of the sample holder to the cold source, characterized in that
    The thermal connection comprise a thermal switch, which thermal switch has at least two different states that are distinguished by a different thermal conduction, as a result of which the thermal conduction from the extremity of the sample holder to the cold source is different for the different states, which, in operation, results in different temperatures of the extremity of the sample holder for the different states of the thermal switch.

2. A particle-optical apparatus according to claim 1, whereby said at least two states are also distinguished by a different thermal conduction from the extremity of the sample holder to a portion of the apparatus that, by approximation, is at room temperature.

3. A particle-optical apparatus according to claim 1, whereby the cooling facilities are embodied to maintain the cold source at cryogenic temperatures.

4. A particle-optical apparatus according to claim 3, whereby the cooling facilities are embodied to keep the cold source at a cryogenic temperature by allowing boiling down of a liquid.

5. A particle-optical apparatus according to claim 4, whereby the boiling-down liquid is liquid nitrogen or liquid helium.

6. A particle-optical apparatus according to claim 1, whereby the thermal switch comprises an element that can be mechanically displaced.

7. A particle-optical apparatus according to claim 1, whereby the thermal switch exhibits more than two different states, which are distinguished in that the thermal conduction of the extremity of the sample holder to different portions of the apparatus is different, which different portions of the apparatus are embodied to exhibit mutually different temperatures.

8. A particle-optical apparatus according to claim 1, whereby the sample holder further comprises a heating means.

9. A particle-optical apparatus according to claim 8, whereby the thermal switch can connect the sample holder to a portion of the apparatus that is embodied to be kept at a temperature above room temperature with the aid of heating means.

10. A particle-optical apparatus according to claim 1, whereby the thermal switch can connect the extremity of the sample holder to a portion of the apparatus that is embodied to be kept at a temperature below room temperature with the aid of Peltier cooling.

11. A particle-optical apparatus according to claim 1, whereby the particle-optical apparatus comprises a particle column from the group of transmission electron columns (TEM columns), scanning transmission electron columns (STEM columns), scanning electron columns (SEM columns) and focused ion beam columns (FIB columns).

12. A method of making a particle-optical apparatus having a capability of selectively switching a sample between two sample temperature, comprising:
    providing a vacuum chamber;
    providing a first cold source outside the vacuum chamber;
    providing a sample holder for holding a sample inside the vacuum chamber;
    providing a conductive path from the cold source to the sample holder, the conductive path connecting to the sample holder inside the vacuum chamber and away from the vacuum chamber wall; and
    providing a switch for selectively connecting and disconnecting the conductive path from the cold source without opening the vacuum chamber or moving the sample to allow the sample the temperature of the sample to be selected.

13. The method of claim 12 in which providing a conductive path comprises providing a flexible cooling conductor.

14. The method of claim 12 in which providing a first cold source includes providing a cryogenic cold source.

15. The method of claim 12 in which providing a switch for selectively connecting and disconnecting the conductive path includes providing a switch for selecting between a first thermally conductive path and a second thermally conductive path, the second thermally conductive path being connected to a second cold source at a temperature different from that of the first cooling source.

16. The method of claim 15 in which the second cold source is a Peltier cold source.

17. A method of observing a sample at different temperatures in a particle optical apparatus:
    inserting a sample into a sample holder in the particle optical apparatus, the sample holder being connected to a cold source through a thermal conductor connected to the sample holder inside the vacuum chamber and away from the vacuum chamber wall;
    observing the sample at a first temperature;

switching a thermal switch to break the thermal connection between the sample holder and the cold source; and observing or modifying the sample at a second temperature without moving the sample.

18. The method of claim 17 in which observing the sample at a first temperature includes observing the sample at a cryogenic temperature.

19. The method of claim 17 in which observing the sample at a second temperature includes observing the sample at room temperature.

20. The method of claim 17 in which switching a thermal switch to break the thermal connection between the sample holder and the cold source includes switching a thermal connector to connect the sample holder to a second cold source.

21. A particle-optical apparatus having a capability of selectively switching a sample between two sample temperature, comprising:

a vacuum chamber;

a first cold source positioned outside the vacuum chamber;

a sample holder for holding a sample inside the vacuum chamber;

a thermally conductive path from the first cold source to the sample holder, the thermally conductive path connecting to the sample holder inside the vacuum chamber and away from the vacuum chamber wall; and a thermal switch for selectively connecting and disconnecting the thermally conductive path from the cold source without opening the vacuum chamber or moving the sample to allow the sample the temperature of the sample to be selected.

22. A particle-optical apparatus according to claim 21, whereby the thermal switch comprises an element that can be mechanically displaced.

23. A particle-optical apparatus according to claim 21 further comprising a second cold source and in which the thermal switch switches the thermally conductive path between the cold source and the second cold source.

24. A particle-optical apparatus according to claim 21 in which the thermally conductive path from the sample terminates in the vacuum chamber when the thermal switch disconnects the thermally conductive path from the cold source.

25. A particle-optical apparatus according to claim 21 further comprising a heater for heating the sample above room temperature.

\* \* \* \* \*